(12) United States Patent
Aoh et al.

(10) Patent No.: US 7,326,640 B2
(45) Date of Patent: Feb. 5, 2008

(54) METHOD OF REALIZING THERMOSONIC WIRE BONDING BETWEEN METAL WIRES AND COPPER PADS BY DEPOSITING A THIN FILM TO SURFACE OF SEMICONDUCTOR CHIP WITH COPPER PADS

(75) Inventors: Jong-Ning Aoh, Chia-Yi (TW); Cheng-Li Chuang, Chia-Yi (TW)

(73) Assignee: National Chung Cheng University, Chia-Yi (TW)

( * ) Notice: Subject to any disclaimer, the term of this patent is extended or adjusted under 35 U.S.C. 154(b) by 299 days.

(21) Appl. No.: 11/180,448

(22) Filed: Jul. 13, 2005

(65) Prior Publication Data

US 2007/0015352 A1    Jan. 18, 2007

(51) Int. Cl.
*H01L 21/44* (2006.01)
*B23K 31/00* (2006.01)
*B23K 31/02* (2006.01)

(52) U.S. Cl. ............... 438/617; 228/180.5; 257/E23.02

(58) Field of Classification Search ................ 438/617; 228/180.5; 257/E23.02
See application file for complete search history.

(56) References Cited

U.S. PATENT DOCUMENTS 6,415,973 B1 * 7/2002 Ho et al. ................. 228/180.5
6,800,555 B2 * 10/2004 Test et al. ................... 438/687
2004/0108362 A1 * 6/2004 Jeng et al. ............... 228/180.5

* cited by examiner

*Primary Examiner*—David Zarneke
*Assistant Examiner*—Jenny L. Wagner
(74) *Attorney, Agent, or Firm*—Dykema Gossett PLLC

(57) ABSTRACT

Disclosed is a method of realizing thermosonic wire bonding between metal wires and copper pads by depositing a thin film to surfaces of semiconductor chips with copper pads, where a thin film that provides the effect of self-passivation to prevent oxidization of the copper pads located thereunder is deposited on surfaces of the copper pads to provide sufficient protection to the chips with copper pads thereby preventing copper from oxidizing at elevated temperature during packaging, due to die sawing, die mounting or curing and thermosonic wire bonding, which would result in failure of bonding metal wires to the copper pads, poor bondability between the metal wires and the copper pads, or low bonding strength of the bonds. By selecting a thin film consisting of an appropriate material to be deposited on the surfaces of copper pads for an appropriate thickness would allow conducting the die sawing, die bonding and thermosonic wire bonding within the packing process under the atmosphere, while successful bonding of the metal balls to the chips with copper pads with perfect bondability and sufficient bonding strength meeting the specifications required by the industry.

4 Claims, 5 Drawing Sheets

METHOD OF REALIZING THERMOSONIC WIRE BONDING BETWEEN METAL WIRES AND COPPER PADS BY DEPOSITING A THIN FILM TO SURFACE OF SEMICONDUCTOR CHIP WITH COPPER PADS

FIELD OF THE INVENTION

The invention relates to a method of realizing thermosonic wire bonding between metal wires and copper pads by depositing a thin film to a surface of a semiconductor chip with copper pads, particularly to a thermosonic wire bonding process adopted in the packaging of chip with copper pads, where a thin film is deposited on a wafer with copper pads in the process of directly bonding metal wires to chip with copper pads.

BACKGROUND

Along with the miniaturization of components and quick development of the process of manufacturing semiconductors to submicron level, the component density of silicon chips per unit area increases dramatically such that the reduced dimension interconnects between the components induces higher electric resistance and the narrow line widths increase the parasitic capacitance thereby resulting in signal delays. An optimum measure of reducing the signal delays is to employ dielectric materials with a low dielectric constant and replace the conventional aluminum interconnects with copper of better electrical conductivity. However, the fabrication of copper interconnects has resulted in significant impacts in the process of packaging due to the entirely different mechanisms involved in the oxidization of copper and aluminum metals. For aluminum, a self-passivation is easily formed on its surface to prevent further oxidation of the aluminum underneath the self-passivation layer, where the aluminum oxide film is scrubbed off by ultrasonic power during thermosonic wire bonding so as to ensure bonding between the metal wires and the aluminum pads. Copper, on the contrary, is easily oxidized under the atmosphere while the copper oxide film does not provide a self-passivation effect as the aluminum oxide film does. Not only does such a characteristic become a bottleneck in the thermosonic wire bonding process adopted in the packaging of semiconductors, it adversely affects the mechanical and physical properties of copper pads. The packaging process employed by electronic components generally includes the process of die sawing, die bonding, wire bonding and encapsulation. During die sawing, the wafer surface is cleaned by deionized water to remove the heat applied to the wafer and to carry away the silicon debris generated during the sawing process. The wafer is then placed in a cleaning and drying machine after die sawing to be further cleansed by deionized water to remove the debris remained on the wafer surface, and then dried. The dried wafer is then adhered to a leadframe by silver thermal adhesive and placed in curing oven to be cured for 0.5 to 1.5 hours at a temperature ranging from 150° C. to 175° C. thereby curing the silver thermal adhesive. During die sawing and die bonding, the wafer is exposed to moisture and atmosphere and is subjected to a high temperature so as to cause considerable oxidization on the surface of copper pads. Further, during the thermosonic wire bonding of copper pads, a proper operation temperature of the thermosonic wire bonder ranges from 120° C. to 220° C. Chips with copper pads, under such an elevated temperature and atmospheric surrounding, may be protected by inert gases or subjected to a high vacuum environment to prevent from oxide film formation on the surfaces of the copper pads. Since it is relatively difficult to realize a vacuum environment in the thermosonic wire bonding process during mass production, it is thus essential for the packaging of chips with copper pads to overcome the problems caused by the copper pad oxidation.

SUMMARY OF INVENTION

In view of the shortcomings of the thermosonic wire bonding process adopted in the packaging of semiconductors, the invention discloses a method of realizing thermosonic wire bonding between metal wires and copper pads by depositing a thin film to the surface of a semiconductor chip with copper pads, particularly to a thermosonic wire bonding process adopted in the packaging of chips with copper pads, where a thin film is deposited on a wafer with copper pads in the process of directly bonding metal wires to chips with copper pads.

It is thus a primary objective of this invention to provide a method of realizing thermosonic wire bonding between metal wires and copper pads by depositing a thin film to the surface of a semiconductor chip with copper pads, where a thin film is deposited on surface of the copper pads to provide sufficient protection to the chips with copper pads thereby preventing copper oxide film formation during packaging so as to bond metal wires to the copper pads in a thermosonic manner.

It is a further objective of this invention to provide a method of realizing thermosonic wire bonding between metal wires and copper pads by depositing a thin film to the surface of a semiconductor chip with copper pads, where the thin film is of an appropriate thickness that may be scrubbed off by ultrasonic power such that metal wires may be bonded to the fresh and clean surfaces of copper pads so as to bond metal wires to the copper pads in a thermosonic manner.

It is another objective of this invention to provide a method of realizing thermosonic wire bonding between metal wires and copper pads by depositing a thin film to a surface of a semiconductor chip with copper pads, where a thin film is first deposited on surfaces of copper pads during fabrication of wafers while the packaging process remains identical to that adopted in the conventional wire bonding process without altering the conventional process or equipments so as to make to the full use of the conventional equipments in the packaging of semiconductor chips with copper pads.

To achieve the above objectives, this invention discloses a method of realizing thermosonic wire bonding between metal wires and copper pads by depositing a thin film to the surface of a semiconductor chip with copper pads, where a thin film is deposited on the surface of the chip with copper pads, such that the bonding strength meets the specification required by the industry after the metal wires are bonded to the copper pads by thermosonic wire bonding, including the steps of: depositing a metal protective film of an appropriate thickness to a surface of the chips with copper pads, where the protective film is joined to a copper layer of the chips with copper pads; subjecting the wafer with copper pads to die sawing, die bonding and thermosonic wire bonding under the atmosphere, where an oxide film is only formed over the protective film that provides self-passivation effect to prevent further oxidization of the copper pads located thereunder; removing the oxide of the metal thin film and the thin film by ultrasonic power generated by a thermosonic wire bonder such that metal wires may be bonded to the fresh and clean surfaces of copper pads. The packaging process of chips with copper pads deposited with a protective film according to this invention may be completely identical to that adopted in a chip with aluminum pads without altering the conventional process or equipments.

BRIEF DESCRIPTION OF THE DRAWINGS

These and other modifications and advantages will become even more apparent from the following detained description of a preferred embodiment of the invention and from the drawings in which.

DETAILED DESCRIPTION OF THE INVENTION (PREFERRED EMBODIMENTS)

Figure 1:
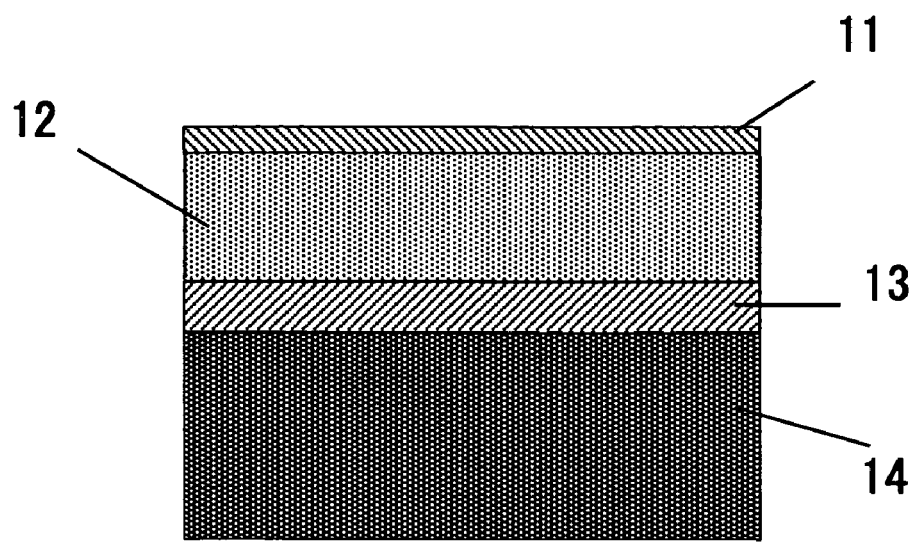
FIG. 1 is a cross-sectional view illustrating a chip with copper pads having a thin protective film according to this invention.
Figure 8:
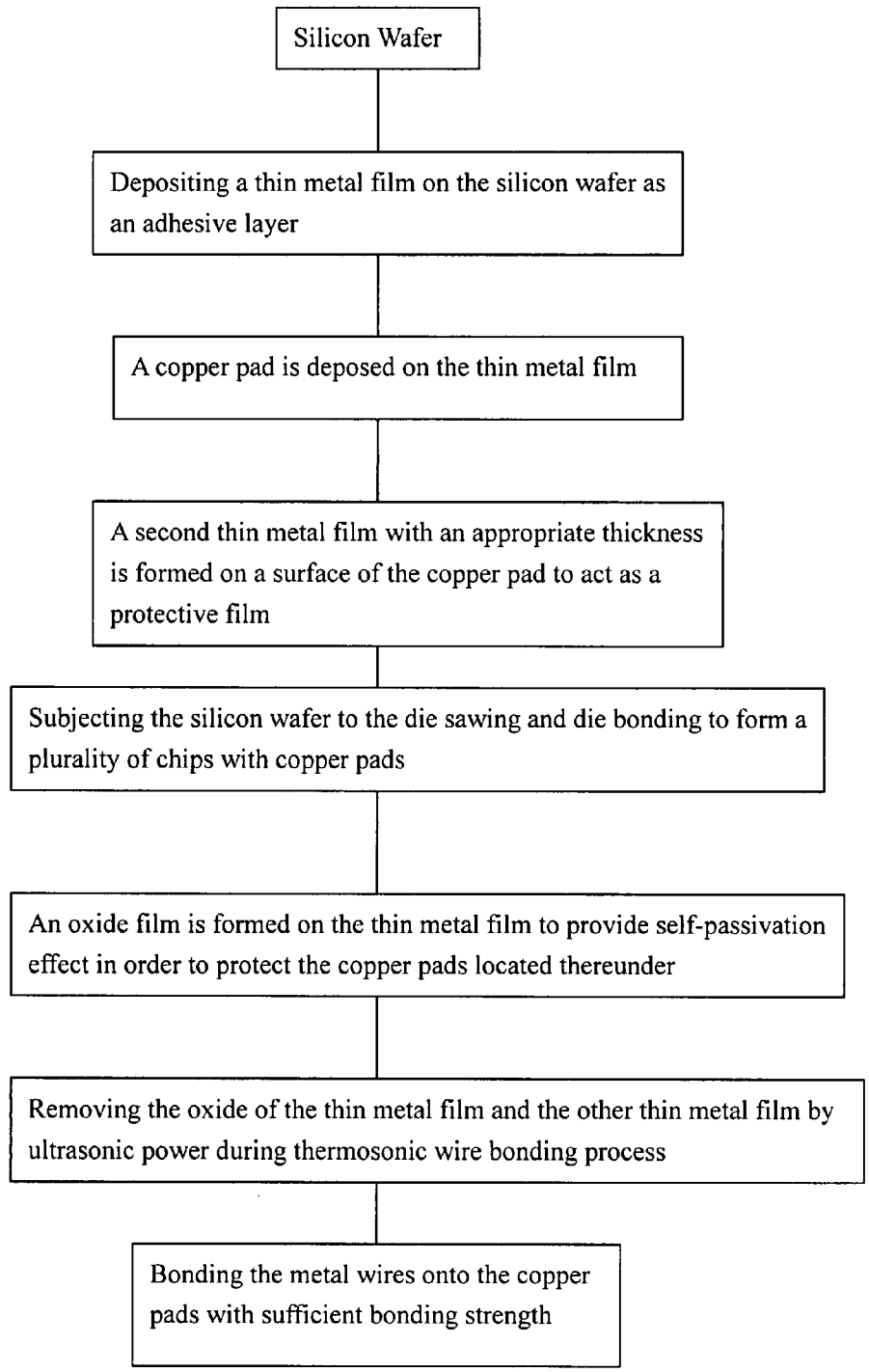
FIG. 8 is an illustration of a method of realizing thermosonic wire bonding according to the invention.

FIG. 1 is a cross-sectional view illustrating a chip with copper pads having a thin protective film according the this invention, and FIG. 8 is a graphic representation of a method for realizing thermosonic wire bonding according to the invention.

According to this invention and FIG. 1, a surface of a silicon wafer 14 with copper pads 12 is deposited firstly with a thin metal film that acts as an adhesive layer 13 to increase the adhesive strength between the silicon wafer 14 and copper pads 12 that is subsequently deposited thereon, and another thin metal film 11 that is joined to the copper pads 12 of the wafer 14 to act as a protective film 11. The protective film 11 that is deposited on the surface allows the wafer 14 with copper pads 12 to be subjected to die sawing and die bonding under an atmospheric surrounding to form a plurality of chips with copper pads 12, where an oxide is only formed over the protective film 11 that provides the effect of self-passivation to prevent oxidation of the copper pads 12 located thereunder. The oxide of the thin metal film 11 may then be removed by the ultrasonic power generated by a thermosonic wire bonder during the thermosonic wire bonding process such that metal wires may be bonded to the fresh and clean surfaces of copper pads 12. The process of packaging the chips with copper pads 12 deposited with the protective film 11 according to this invention may be completely identical to that adopted in a chip with aluminium pads without altering the conventional process or equipments.

The protective film 11 of this invention consists of a material that may be selected from metals, including titanium, chromium, tantalum, magnesium or zirconium, which would form an oxidized film that is in fact a ceramic material, such as titanium oxide, chromium oxide, tantalum oxide, magnesium oxide or zirconium oxide having a hard and brittle property, while subjecting the chip to die sawing and curing in die bonding under the atmosphere, whereby an appropriate ultrasonic power would be able to crack or scrub off the oxide film through the oscillating motion generated by a bonding capillary such that the bonding between metal wires and the clean copper pads may serve as good bonds.

The appropriate thickness of the protective film (11) of this invention is crucial to the bondability and bonding strength achieved by the thermosonic wire bonding process, as a protective film having a thickness beneath a desired value is unable to provide satisfactory protection while that having a thickness beyond a desired value, despite its excellent protection effect, cannot be easily scrubbed off by the ultrasonic power generated by a thermosonic wire bonder so as to result in inferior bonds. It is found that protective film is preferred to have a thickness ranging from 1 nm to 50 nm depending on the metal elements as employed to form the protective film.

The film deposition technology adopted in forming the protective film (11) of this invention may include physical vapor deposition (PVD), chemical vapor deposition (CVD), electroplating, electroless plating or any other relevant techniques.

The following embodiments that adopt the process and the chips with copper pads of this invention by subjecting the metal wires and chip with copper pads to the thermosonic wire bonding process, are discussed to show the effectiveness of this invention, but do not intend to limit the scope of the invention.

A surface of a bare silicon wafer 14 (P type [111]) is firstly deposited with a titanium film 13 of 1000 Å over the silicon wafer 14 by means of argon ion target sputtering to enhance the adhesive strength between the silicon wafer 14 and the copper pads 12 that is subsequently deposited thereover. A copper pad 12 of 12000 Å is then deposited on the titanium film 13 that acts as an adhesive layer. A titanium film 11 of 3.5 nm, is then deposited on a surface of the copper pads 12 to serve as a protective film 11 of the copper pads 12. The wafer 14 with copper pads 12 deposited with the protective film 11 is then subject to a packaging process under the atmosphere, including: die sawing, and die bonding to form a plurality of chips with copper pads 12. The chip with copper pads 12 upon the die sawing process is then adhered to a leadframe by silver thermal adhesive and placed in a curing oven to be cured at 175° C. for 30 minutes thereby curing the silver thermal adhesive. The cured chip with copper pads is then subject to the thermosonic wire bonding under the atmosphere. The parameters employed by the thermosonic wire bonder are as shown in Table I.

TABLE I

| Ultrasonic power | 0.09 W-0.29 W (with a scale configured to 70-140 on the control panel) |
|---|---|
| Bonding load | 0.5 N |
| Bonding time | 20 ms |
| Temperature of heating stage | 200° C. |
| Metal wires diameter | 25 μm |

Figure 2:
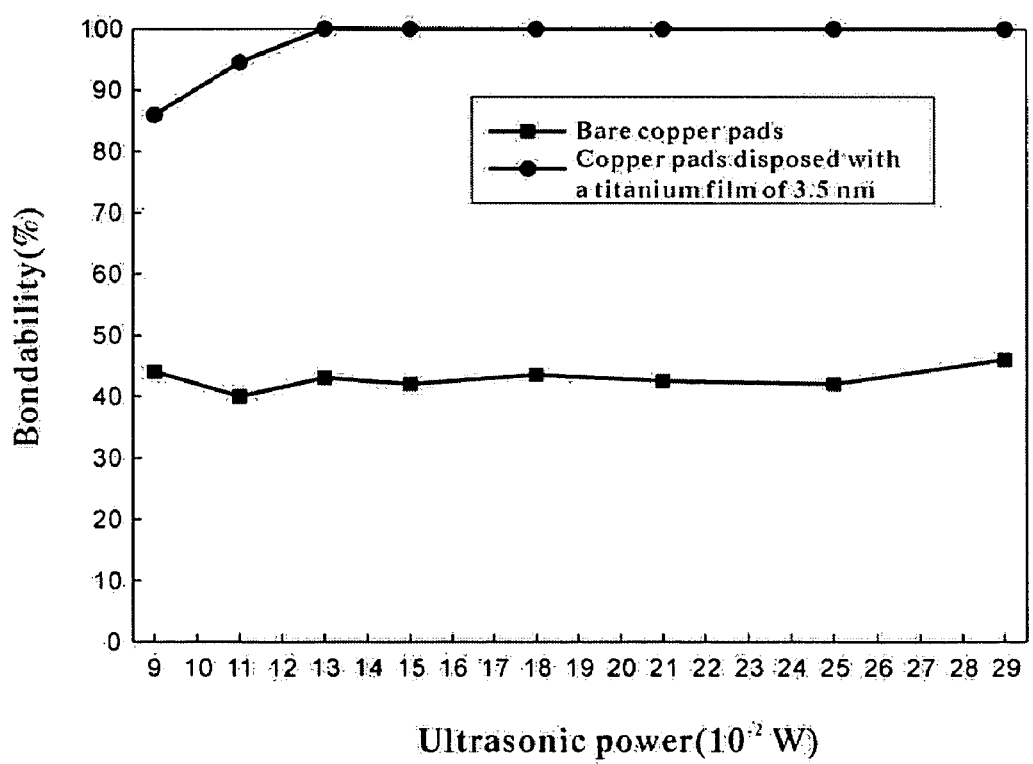
FIG. 2 is a comparative plot showing the relationships between the bondability and ultrasonic power upon subjecting the metal wires of the copper pads deposited with a protective film of this invention and those of the bare copper pads to the thermosonic wire bonding process when the heating stage is heat to 200° C.
Figure 3:
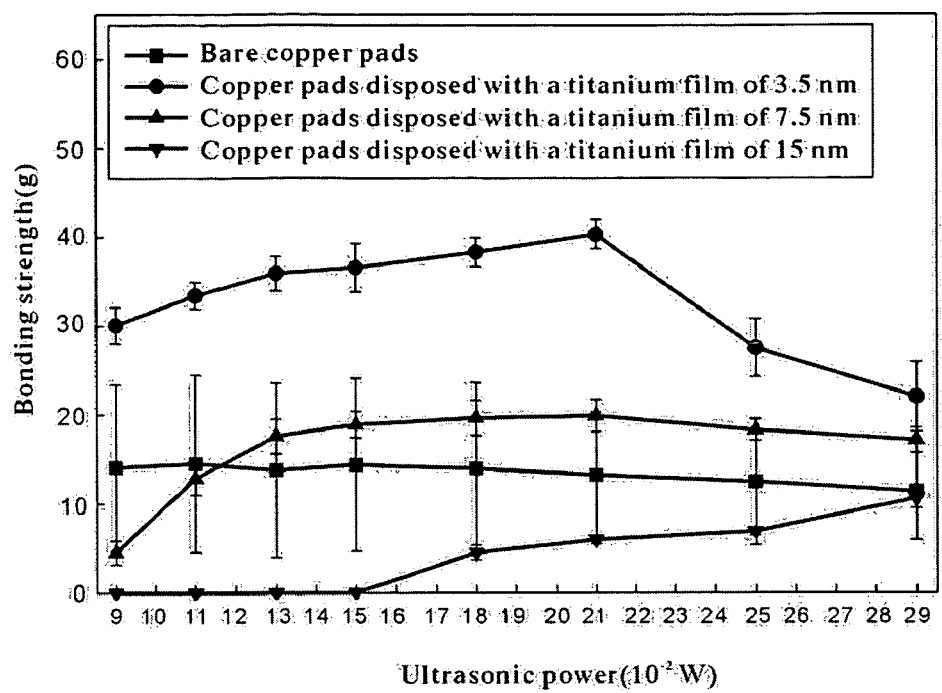
FIG. 3 is a comparative plot showing the relationships between bonding strength and ultrasonic power upon subjecting the metal wires on copper pads deposited with a protective film of this invention and those on the bare copper pads to the thermosonic wire bonding process when the heating stage is heat to 200° C.

A comparison between the bondability of metal wires on copper pads deposited with protective film is shown in FIG. 2. The bondability between the metal wires and copper pads with a titanium protective film increases with increasing bonding power and reaches 100% when the ultrasonic power exceeds 0.13 W. On the contrary, the bondability between the metal wires and copper pads without protective film is only in the range of 40-45% independent of bonding power, which is apparently lower than the bondability between the metal wires copper pads with a titanium protective film. That is, the protective film deposited on copper pads significantly increases the bondability between metal wires and copper pads to 100%. As for the bonding strength between the metal wires and chip with copper pads, as shown in FIG. 3, the trend for bonding strength is similar to that for bondability; that is, bonding strength is achieved to certain value for the chip with copper pads that is deposited with and without a titanium protective film, where the bonding strength for the chip with copper pads that is deposited with a titanium protective film is much higher than that of bare copper pads. These figures show that this invention can significantly improve the bonding strength between the metal wires and chip with copper pads. As shown in FIG. 3, a higher value of ultrasonic power (0.21 -0.29 W) would reduce the bonding strength because excessive ultrasonic power would cause serious plastic deformation of the stud balls of the metal wires thereby reducing the bonding area between wires and the copper pads and therefore reducing the bonding strength. Accordingly, the appropriate ultrasonic power suitable for bonding metal wires having a wire diameter of 25.4 μm ranges from 0.11 -0.21 W.

Figure 4:
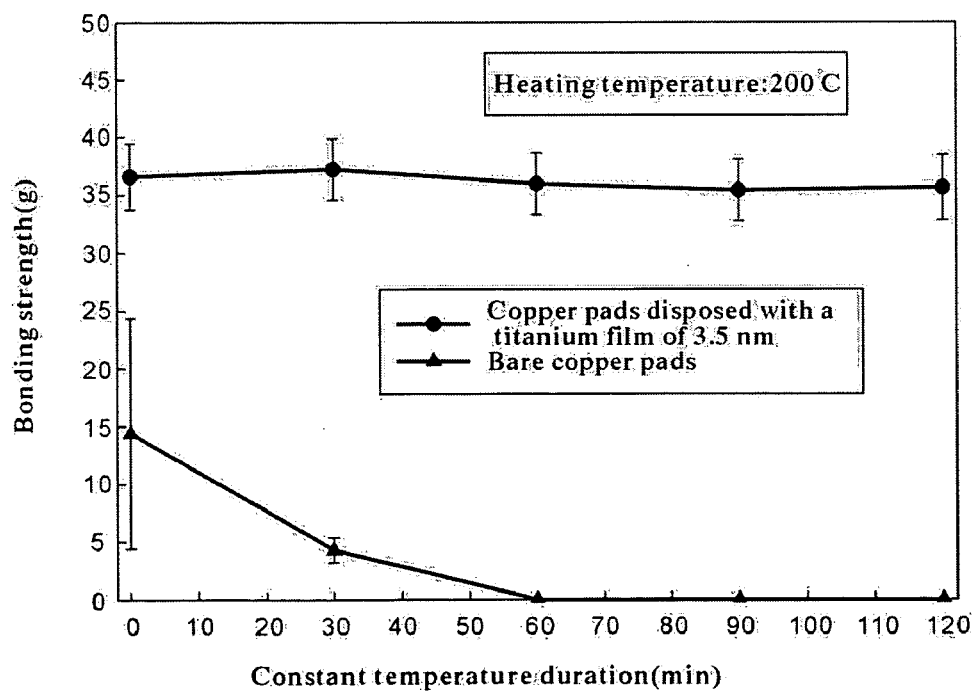
FIG. 4 is a comparative plot showing the relationships between bonding strength and constant temperature duration after maintaining the copper pads deposited with a protective film of this invention and the bare copper pads at 200° C. under an atmospheric surrounding after being subjected to the thermosonic wire bonding process.

To show that the titanium protective film that is deposited on the surface of the chip with copper pads can in fact prevent oxidization of the copper pads, both chips with copper pads that are deposited with and without a titanium protective film are heated in an oven at a constant temperature of 200° C. under an atmospheric surrounding for 0-120 minutes. The samples are then removed from the oven for every 30-minute interval, subjected to the thermosonic wire bonding, followed by measuring the bonding strength of the bonds, as shown in FIG. 4. The strength of the bonds for chips with copper pads that are deposited with a protective film is maintained within the ranges of 35 to 40 g, which is independent of the duration that the chips are subjected to the heated surrounding. Such a result indicates that the titanium protective film effectively serves to protect the chips with copper pads that are subject to a heated temperature (at 200° C.) for a longer period of time (for 120 minutes), while preventing the formation of copper oxide film on the copper pads. The titanium protective film deposited on the surfaces of copper pads is transformed into a titanium oxide film which is in fact a ceramic material having a hard and brittle property, whereby an appropriate ultrasonic power would be able to scrub off or partially remove the titanium oxide film such that the bonding between metal wires and the fresh and clean copper pads may achieved with sufficient bonding strength. On the contrary, the bonding strength of the chips with bare copper pads decreases with increasing heating duration. Such a result implies that the copper oxide film continues to grow over the surfaces copper pads during heating. The oxide of the copper pads cannot be removed by the ultrasonic power and becomes a barrier for the diffusion bonding between the metal wires and copper pads, thereby resulting in a poor bonding strength, which is far below the standards required by the industry [1]. Accordingly, these results prove the necessity of this invention in the thermosonic wire bonding between metal wires and copper pads.

Figure 5:
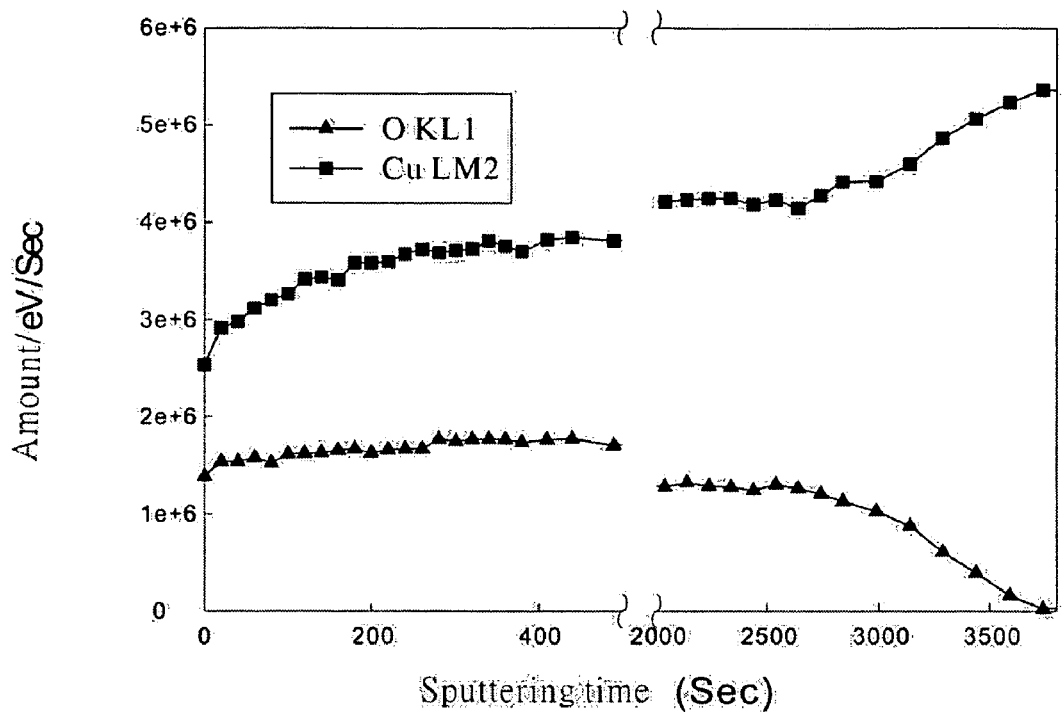
FIG. 5 is a distribution curve illustrating the amount of the oxygen atoms along the depth within the surfaces of the copper pads after curing the chip with copper pads in die bonding (at 175° C. for 30 minutes).
Figure 6:
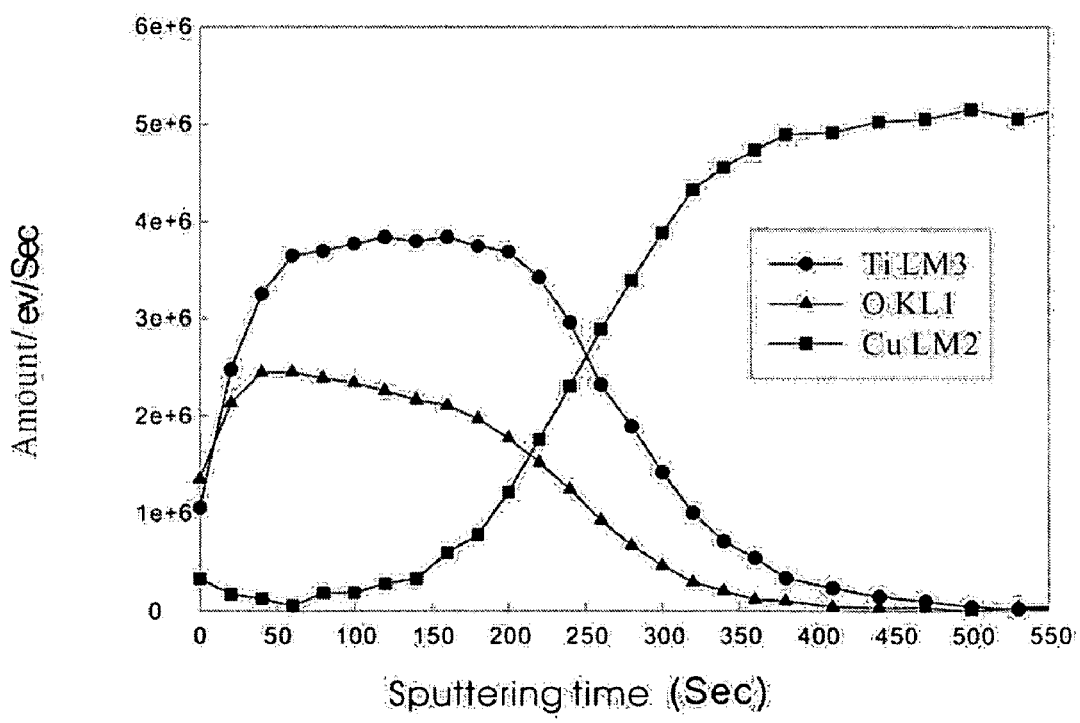
FIG. 6 is a distribution curve illustrating the amount of the oxygen atoms along the depth within the surfaces of the copper pads deposited with a protective film after curing the chip with copper pads in die bonding (at 175° C. for 30 minutes).
Figure 7:
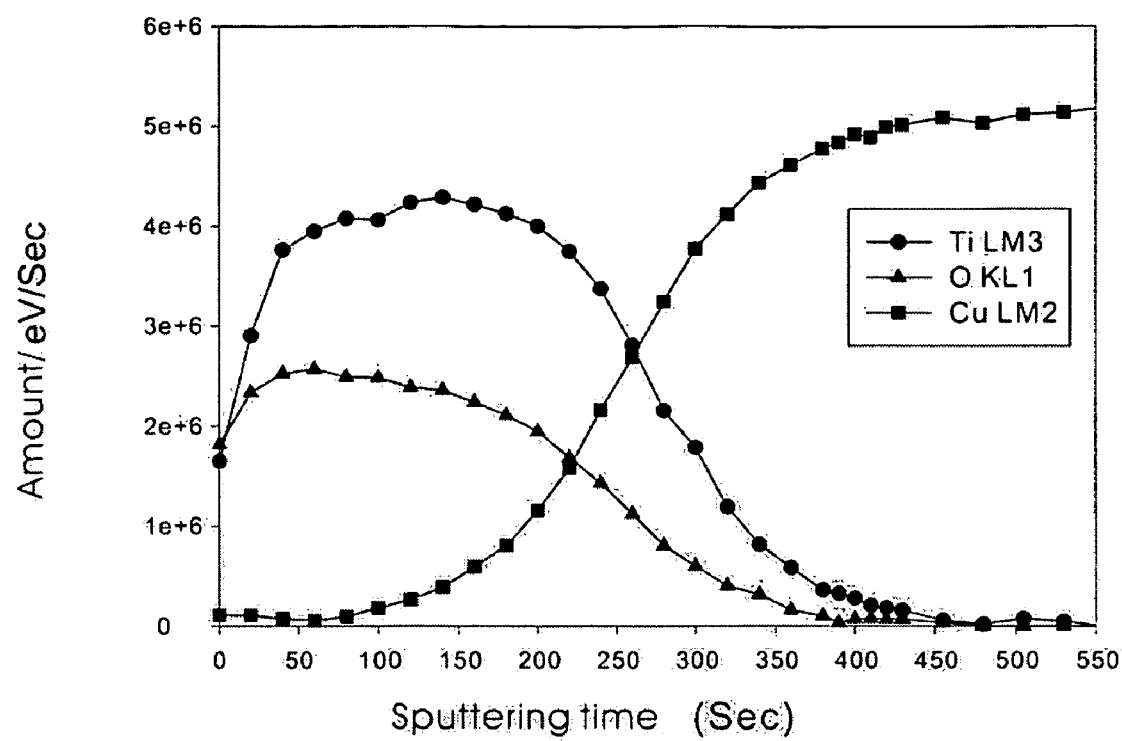
FIG. 7 is a distribution curve illustrating the amount of the oxygen atoms along the depth within the surfaces of the copper pads deposited with a protective film after curing the chip with copper pads in die bonding at 175° C. for 30 minutes and subsequent oxidation at 200° C. for 120 minutes under an atmospheric surrounding.

To show the effectiveness of the thin film in reducing copper oxide film growth rate on the chips with copper pads, the chips with copper pads that are deposited with and without a titanium protective film are first subjected to curing during die bonding. The surfaces of such chips are then analyzed by Auger electron spectrometers (AES) to examine the distribution curves of the amount of the oxygen atoms along the depth within the surfaces of the copper pads, as shown in FIGS. 5 and 6. The chips with copper pads that are deposited with a titanium protective film and subjected to curing in die bonding are then heated in an oven at a constant temperature of 200° C. under an atmospheric surrounding for 120 minutes. The surfaces of such chips are then analyzed by Auger electron spectrometers (AES) to examine the distribution curves of the amount of the oxygen atoms along the depth within the surfaces of the copper pads, as shown in FIG. 7.

By comparing the distribution curves of the oxygen atoms shown in FIGS. 5 and 6, it is known that the copper oxide film on the surfaces of the copper pads grows rapidly if the surfaces of the chips with copper pads are not deposited with a titanium protective film. If the thermosonic wire bonding is conducted subsequently, the bondability and the bonding strength between the metal wires and chip with copper pads would tend to be low. On the contrary, it is also found that only titanium oxide film is formed on top of the titanium protective film, if the chips with copper pads are deposited with titanium protective film. By analyzing the titanium oxide film by means of electron spectroscopy for chemical analysis (ESCA), it is known that the binding energy of the titanium atoms is 458.8 eV (Ti 2 p 3/2) and 464.6 eV (Ti 2 p 1/2), thereby it can be identified that the titanium oxide film consists of titanium ($TiO_2$). $TiO_2$ is a ceramic material having a hard and brittle property, whereby an appropriate ultrasonic power generated during the thermosonic wire bonding is able to scrub off the $TiO_2$ oxide film to provide fresh and clean contact and thus ensures a good bonding between metal wires and clean copper pads. By comparing the distribution curves of the oxygen atoms shown in FIGS. 7 and 6, one can easily observe that the two distribution curves of the oxygen atoms are extremely similar. Such a result indicates that if the chips with copper pads that are deposited with a titanium protective film and then are cured at elevated temperature (at 200° C.) for a long period of time (for 120 minutes), the prolonged heating does not result in a oxidization of the chips with copper pads where only the amount of the oxygen atoms along the depth within the surfaces of the titanium protective film increases but not the depth, so as to ensure perfect bondability and sufficient bonding strength as shown in FIG. 4.

The afore-described examples show that, not only can the process of depositing a protective film disclosed by this invention significantly increase the bondability between the metal wires and chips with copper pads to 100%, but also effectively ensure the bonding strength between the metal wires and chips with copper pads, thereby improving the reliability of the thermosonic wire bonding between the metal wires and chips with copper pads. In addition, the packaging process of the chip with copper pads deposited with a protective film according to this invention may be completely identical to that adopted in a chip with aluminum pads without altering the conventional process or equipments.

The present invention has been described with a preferred embodiment thereof and it is understood that the scope and the spirit of the invention as defined by the appended claims.

REFERENCE

1. JEDEC (EIA) Solid State Technology Product Engineering Council, Arlington, 1998.

What is claimed is:

1. A method of realizing thermosonic wire bonding between metal wires and copper pads by depositing a thin metal film to a surface of a semiconductor wafer with copper pads, wherein the thin metal film deposited on the surface of the semiconductor wafer is to ensure a perfect bonding and sufficient bonding strength between the metal wires and the copper pads after being subjected to the thermosonic wire bonding process, the method comprises the steps of:

depositing another thin metal film of an appropriate thickness to the surface of the wafer with the copper pads, where the thin metal film is deposited onto copper pads of the wafer to act as a protective film;

subjecting the wafer with copper pads to die sawing and die bonding under an atmospheric surrounding to form a plurality chips with copper pads, where an oxide film is only formed on the thin metal film to prevent oxidation from occurring in the copper pads located thereunder;

removing the oxide of the thin metal film and the other thin metal film by ultrasonic power generated by a thermosonic wire bonder such that the metal wires may be bonded to the clean surfaces of copper pads;

whereby the packaging process of the chips with copper pads deposited with the thin metal film is completely identical to that adopted in chips with aluminium pads without altering the conventional process or equipments.

2. The method of realizing thermosonic wire bonding between metal wires and copper pads by depositing a thin metal film to a surface of a semiconductor wafer with copper pads of claim 1, wherein the thin metal film is deposited on the wafer with copper pads by physical vapour deposition (PVD), chemical vapour deposition (CVD), electroplating, electroless plating or any other relevant techniques.

3. The method of realizing thermosonic wire bonding between metal wires and copper pads by depositing a thin film to surface of semiconductor chip with copper pads of claim 1, wherein the appropriate thickness of the thin film ranges from 1 nm to 50 nm.

4. The method of realizing thermosonic wire bonding between metal wires and copper pads by depositing a thin film to surface of semiconductor chip with copper pads of claim 1, wherein the thin film may consists of a metal element, including any of titanium or other metal oxides, such as titanium oxides ($Ti_xO_y$).

* * * * *